United States Patent [19]

Bose et al.

[11] Patent Number: 5,483,693
[45] Date of Patent: Jan. 9, 1996

[54] COMBINING ANTENNA ELEMENT SIGNALS

[75] Inventors: Amar G. Bose, Wayland; Richard Kirkpatrick, Lynnfield, both of Mass.

[73] Assignee: Bose Corporation, Framingham, Mass.

[21] Appl. No.: 854,345

[22] Filed: Mar. 19, 1992

[51] Int. Cl.⁶ .................................................. H04B 1/16
[52] U.S. Cl. ...................... 455/273; 455/143; 455/277.1; 455/289; 455/291; 343/712
[58] Field of Search ................................. 455/132, 133, 455/134, 135, 137, 140, 142, 272, 273, 277.2, 279.1, 283, 289, 290, 291, 292, 276.1, 143, 144, 277.1; 343/853, 858, 713, 712; 375/100; 342/418

[56] References Cited

U.S. PATENT DOCUMENTS

| | | | |
|---|---|---|---|
| 2,513,485 | 7/1950 | Herrick | 455/144 |
| 2,653,227 | 9/1953 | Onder | 455/143 |
| 2,685,643 | 8/1954 | Fisk et al. | 455/143 |
| 3,472,967 | 10/1969 | Wofford et al. | 455/143 |
| 3,986,124 | 10/1976 | Mitchell, Jr. | 455/137 |
| 4,006,421 | 2/1977 | Mermoz | 455/291 |
| 4,041,496 | 8/1977 | Norris | 342/418 |
| 4,748,682 | 5/1988 | Fukae et al. | 455/137 |
| 4,850,037 | 7/1989 | Bochmann | 375/100 |
| 5,089,829 | 2/1992 | Haruyama et al. | 343/852 |

FOREIGN PATENT DOCUMENTS 56-168443  12/1981  Japan ...................... 455/142

*Primary Examiner*—Chi H. Pham
*Attorney, Agent, or Firm*—Fish & Richardson

[57] ABSTRACT

A vehicle radio receiver circuit includes two antennas for mounting on the vehicle. The antennas are significantly less than one quarter of a wavelength in length at the desired frequency of operation, and the outputs of the antenna elements are coupled to two inputs of an FM circuit and two inputs of an AM circuit, which includes summing circuitry. The FM circuit has an FM output for providing a received FM signal, and the AM circuit has an output for providing an AM signal that includes a sum of signals derived from the outputs of the antennas.

27 Claims, 3 Drawing Sheets

COMBINING ANTENNA ELEMENT SIGNALS

The present invention relates in general to antenna systems and more particularly concerns novel apparatus and techniques for combining signals from a plurality of antennas to provide good reception for signals in the high frequency FM band and medium frequency AM band with relatively small antennas.

Veranth (U.S application Ser. No. 07/540,108 also assigned to the assignee of this application, the disclosure of which is incorporated herein by reference and is attached hereto as Appendix A) discloses a tunable antenna system which includes a high-Q antenna having a length significantly less than a quarter wavelength at the desired frequency of operation. A controllable reactive element is coupled to the antenna for tuning the antenna in a high-Q resonant circuit to the desired signal frequency. An antenna tuning circuit responsive to the frequency to which the antenna is tuned provides an antenna tuning signal to the controllable reactive, element so that the antenna remains tuned to the frequency of the desired signal. The antenna tuning signal is dithered to allow the system to capture the desired signal.

Certain vehicle radio systems use multiple antennas, typically two, in a diversity system that selects the signal from the antenna then having the better quality signal or combines the signals in a predetermined manner. Parker (U.S. application Ser. No. 07/783,273, also assigned to the assignee of this application, the disclosure of which is incorporated by reference and is attached hereto as Appendix B) discloses a tunable diversity antenna system that includes two antennas that are each significantly less than a quarter wavelength at the desired frequency of operation. Each antenna is coupled to one of a pair of controllable reactive elements and one of a pair of antenna-tuning circuits, which provide tuning signals to the reactive elements. A circuit independently controls the two antenna-tuning signals respectively.

In one general aspect, the invention is directed to a vehicle radio receiver circuit that includes two antenna elements for mounting on the vehicle. The antennas are significantly less than one quarter of a wavelength in length at the desired frequency of operation, and the outputs of the antenna elements are coupled to two inputs of an FM circuit and two inputs of an AM circuit, which includes summing circuitry. The FM circuit has an FM output for providing a received FM signal, and the AM circuit has an output for providing an AM signal that includes a sum of signals derived from the outputs of the antennas.

The receiver circuit of the invention permits the benefits of increased clarity provided by diversity in FM reception, while also providing increased power in AM reception by summing received AM signals. This allows for the use of a pair of antennas that are significantly less than a quarter wavelength at the desired frequency of operation. The shorter antennas are easier to locate on the exterior surface of the vehicle than are longer ones. They are also mechanically less complicated and therefore less expensive. The shorter antennas permitted by the invention are less prone to damage, as they present a smaller exposed length to obstacles, such as tree branches. The shorter antennas can also be economically reinforced to further reduce their risk of damage and/or vandalism, or may be covered with a protective dome of nonconductive material.

Other features, objects and advantages of the invention will become apparent from the following detailed description and from the claims when read in connection with the accompanying drawing in which:

Figure 1:
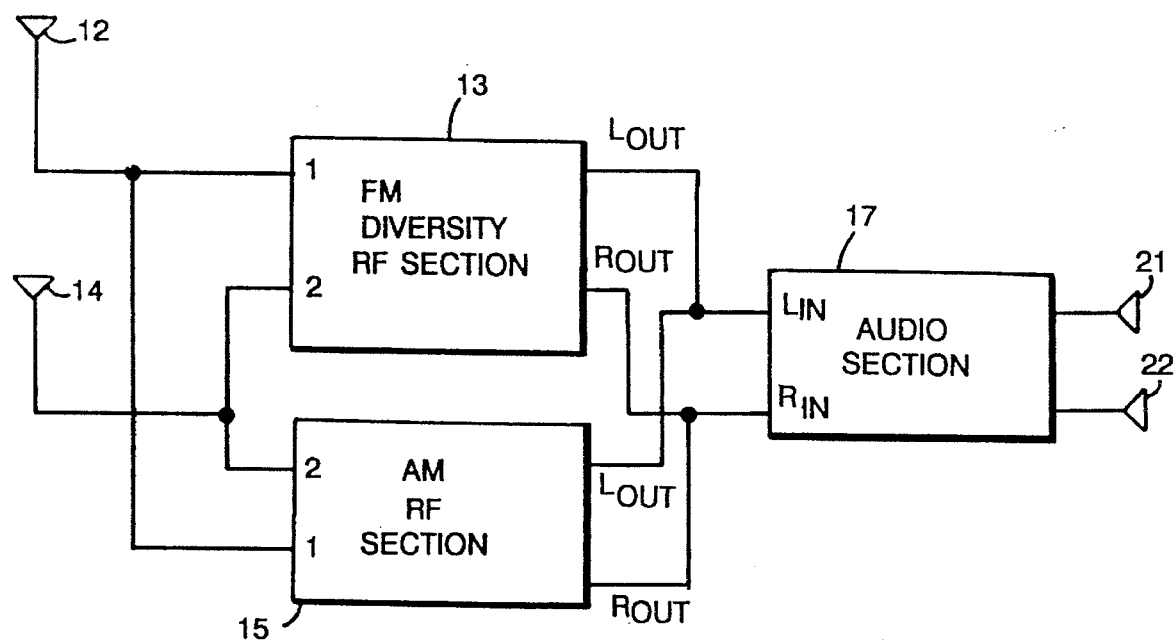
FIG. 1 is a block diagram illustrating the logical arrangement of a system according to the invention.

With reference now to the drawing and more particularly FIG. 1 thereof, there is shown a block diagram illustrating the logical arrangement of a system according to the invention. First and second antennas 12 and 14 each having tip and base ends are connected to 1 and 2 inputs, respectively, of both FM diversity RF section 13 and AM RF section 15 which provide left and right audio output signals on $L_{out}$ and $R_{out}$ outputs, respectively, to left and right inputs $L_{in}$ and $R_{in}$, respectively, of audio section 17. Audio section 17 provides amplified left and right signals to loudspeakers 21 and 22, respectively.

FM diversity RF section 13 preferably embodies the invention as disclosed in the before said Veranth and Parker applications resulting in good FM stereo reception with very short antennas. By additively combining the signals provided by these very short antennas 12 and 14 in AM RF section, there is sufficient signal to provide good AM reception with these very short antennas.

Figure 2A:
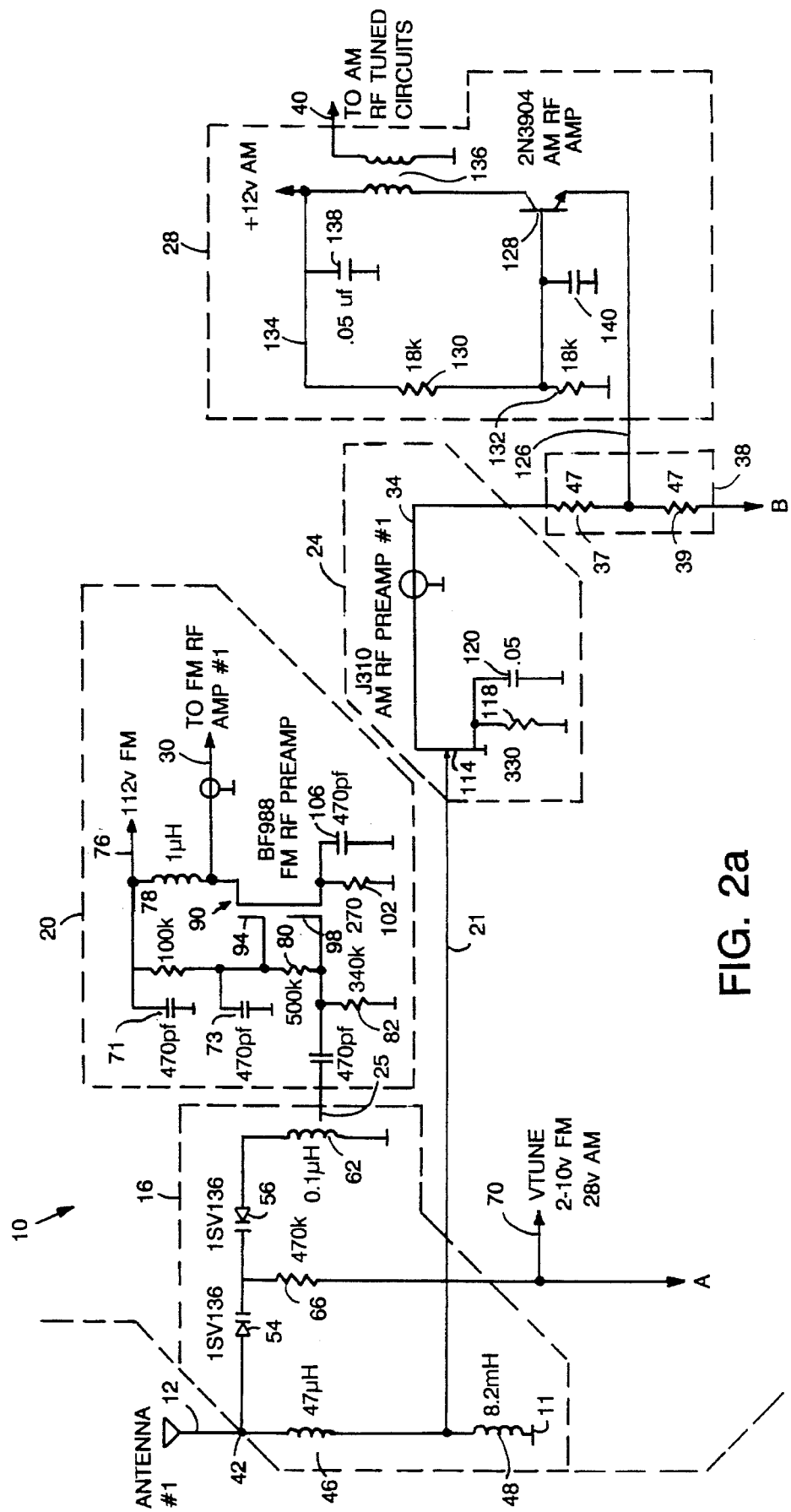
FIG. 2 is a schematic circuit diagram of an exemplary embodiment of the invention.
Figure 2B:
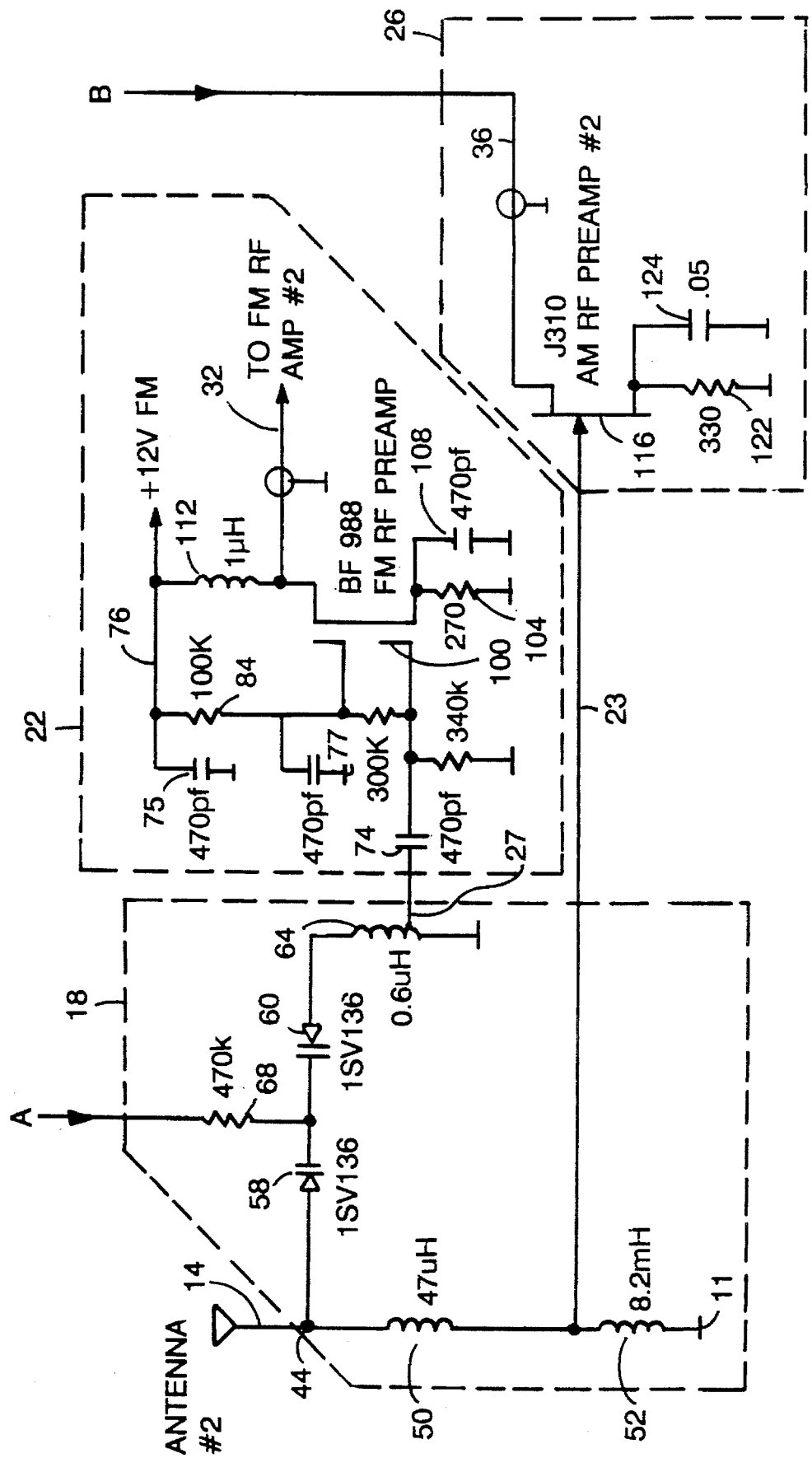

Referring to FIG. 2, there is shown a schematic circuit diagram of an exemplary embodiment of the invention including specific parameter values. The antenna combining receiver circuit 10 according to the invention is typically part of a complete radio receiver for installation within a vehicle (not shown). The antenna combining receiver circuit includes tuning circuits 16, 18 wired to a pair of antennas 12, 14. Tuning circuits 16 and 18 and preamplifiers 24 and 26 are preferably installed at the base of each antenna. FM RF preamplifiers 20 and 22 may also be installed at the base of the antennas. The latter preamplifiers may be installed elsewhere if connected to a respective antenna by a coaxial transmission line of electrical length that is substantially an integral number of half wavelengths. The tuning circuits include FM outputs 25, 27, for providing signals to a pair of FM RF preamplifiers 20, 22 located at the base lends of antenna elements 12, 14 and AM outputs 21, 23 for providing signals to a pair of AM RF preamplifiers 24, 26. The FM preamplifiers each include an output 30, 32, which each provide a preamplified FM signal to other circuits in the receiver that typically perform decoding and amplification of a received FM audio program. The AM preamplifiers each include an output 34, 36 coupled to an RF amplifier 28 by an adding circuit 38. The AM RF amplifier includes an amplified AM sum output 40, which provides an AM sum signal to other parts of the receiver for further processing, such as decoding and amplifying, to produce a received AM audio program.

The first and second antennas 12, 14 are typically identical and may be monopole (or whip) antennas, which are significantly less than one quarter of a wavelength in length at the desired frequency of operation. In one embodiment, for reception in automobiles of broadcast audio programs, the length of the antennas was ten inches. Each antenna includes an output 42, 44 that couples it to the input of one of the tuning circuits 16, 18.

The tuning circuits 16, 18 are generally identical high-Q (Q>100) tuning circuits, which each include a first 46, 50 inductor in the electrical path between the input of the tuner and the AM output 21, 23 of the tuner, and a second 48, 52 inductor located in the path between the AM output of the tuner and ground 11. Each tuning circuit also includes first 54, 58 and second 56, 60 controllable reactive elements, such as oppositely poled varactors, and a third inductor 62, 64 located in series in a path between the input of the tuning circuit and ground. A resistor 66, 68 is located in each path between the tuning input lead 70 and a point between the respective varactors. The FM outputs 25, 27 are each provided from taps on the respective third inductors 62 64.

The FM preamplifiers 20, 22 are typically identical and each of them includes an input capacitor 72, 74 and a biasing network including first 78, 84, second 80, 86 and third 82, 88 series bias resistors placed in an electrical path between a 12-volt FM power supply rail 76 and ground. In each FM preamplifier, a first gate 94, 96 of a dual-gate MOSFET 90, 92 receives a bias voltage from a point between the first and second bias resistors, and a second gate 98, 100 is coupled to the input capacitor and a point between the second and third bias resistors. A source resistor 102, 104 and a source capacitor 106, 108 are placed in parallel between the source of the MOSFET and ground. A drain inductor 110, 112 is located between the FM supply rail and the drain of the MOSFET, which is used as the FM output 30, 32 of the preamplifier. This output is shielded and provided to further circuitry within the receiver. A first capacitor 71, 75 is located between ground and the FM supply rail, and a second 73, 77 is located in an electrical path between the first gate and ground.

The AM preamplifiers 24, 26, which are generally identical, each include an input connected to the gate of a JFET 114, 116. In each AM preamplifier, a source resistor 118, 122 and a source capacitor 120, 124 are placed in parallel between the source of the JFET and ground, and the drain of the JFET is used as the AM output 34, 36 of the preamplifier. This output is shielded and provided to the adding circuit 38.

The adding circuit includes two series oscillation-suppressing resistors 37, 39 placed in a path between the outputs of the first and second AM preamplifiers. The adding circuit also includes an output 126 connected to a point located in an electrical path between the summing resistors. The output is provided to the input of the AM RF amplifier 28.

The RF amplifier includes a transistor 128 that has an emitter connected to receive the output of the summing circuit. A biasing network includes first 130 and second 132 bias resistors connected between ground and a 12-volt AM supply rail 134. The base of the transistor is connected to a point in a path between these first and second resistors. This point is also connected to a path to ground which includes a capacitor 140. A second capacitor 138 is included in a path from the AM supply rail and ground. The primary windings of an RF transformer 136 are located in a path between the AM supply rail and the collector of the transistor, and the secondary windings provide the AM output 40, which is typically connected to further circuitry within the receiver.

The antenna combining circuit 10 therefore includes circuit portions defining an AM circuit and circuit portions defining an FM circuit. Certain elements, including the components of the tuning circuits, are parts of both of these circuits, allowing for a reduced part count, which lowers the cost and improves the reliability of the combining circuit.

Each of circuits 16 and 18 furnishes an AM output and an FM output from an associated output while the circuitry of the unselected band minimizes the effect on the circuitry of the selected band. That is, the FM resonant circuit comprising varactor diodes 54, 56 and inductor 62 presents a high impedance at AM band frequencies when AM reception is selected. Raising the tuning voltage on line 70 to a high level reduces the capacitance of varactors 54 and 56 to establish this high impedance at AM band frequencies. Inductors 46 and 48 and gate 114 present a sufficiently high impedance at FM band frequencies.

The AM preamplifier input comprising inductors 46 and 48 in line 21 and circuitry 24 are untuned. There is a band pass characteristic extending approximately between 400 kHz and 10 MHz. The FM input circuit is tuned to the selected channel in the FM band as described above.

In operation, when a user wishes to receive an AM broadcast, the user operates a band select control (not shown) on the receiver, which causes the receiver to place a fixed 28 volt potential on the tuning input lead 70. This sets the reactance of the varactors 54, 56, 58, 60 to a level that permits optimum tuning by each of the two tuner circuits 16, 18 of AM signals within the desired AM operating band. The tuners present the resulting signals on their outputs 21, 23, and the separate AM preamplifiers preamplify these signals.

Each AM preamplifier comprises a cascode circuit. Circuitry sums the output currents of two common-source stages into one common-base stage. The source impedance of the output of common-source FET stages 24, 26 is very high while the driving-point impedance of common-base bipolar junction transistor stage 28 is very low. Thus, all incremental current from either FET stage flows in the emitter to provide an emitter current that is the vector sum of the output current of FET stages 24 and 26. Resistors 37 and 39 suppress spurious out-of-band oscillations. AM RF amplifier 28 amplifies the sum signal and provides it to other circuits within the receiver. The amplified sum signal will generally have an amplitude level that is double that derived from a single antenna. The invention provides clearer reception of AM broadcasts.

The invention enhances signal-to-noise ratio when reception is internally noise-limited; that is, noise developed in the antenna does not override the internal noise of the receiver. Antenna noise overrides receiver noise when the system is externally noise-limited. In the specific embodiment using short antennas, system operation is on the border line of external and internal noise-limited conditions.

During internal noise-limited conditions at the RF preamp output, there is a component of desired RF signal, half of which comes from each antenna. Using two antennas doubles this output signal voltage compared with using a single antenna. There are also two components of noise, one from each preamplifier circuit. Since these noise components are uncorrelated, the preamplifier output noise power is twice that for a system with a single antenna. The resulting improvement is six dB in signal, and three dB in noise, thereby providing a three dB improvement in signal-to-noise ratio.

An important advantage of the invention resides in using two antennas of length shorter than the length required for a single antenna to produce the same signal-to-noise ratio in AM operation. While the invention is particularly advantageous in a system using short antennas for diversity FM reception, it is useful in any internally noise-limited radio receiving system.

When the user wants to listen to an FM broadcast, the user sets the band select control to the FM position, which causes the receiver to place a voltage on the tuning input lead that is between 2 and 10 volts. This voltage level may be varied to provide optimum reception for the particular desired frequency, and is derived from circuitry in the receiver that operates in accordance with the principles presented in the earlier-referenced commonly assigned applications. The tuning circuits 16, 18 present the resulting signals to the FM RF preamplifiers 20, 22, which preamplify them and provide them to the receiver on their outputs 30, 32. Further circuitry within the receiver may operate to select, from these two preamplified signals, the one with the highest value of a desired quality, such as carrier amplitude.

The invention takes advantage of the properties that the wavelength at AM broadcast band frequencies is much longer than the wavelength for FM broadcast band frequencies. For FM signals at least two FM antennas are separated by a distance comparable to the wavelength of frequencies in the FM band such that each antenna receives different FM signals, a useful property for diversity reception, for example. Yet this physical spacing is a small fraction of a wavelength at frequencies in the AM band. The result is that the two antennas receive approximately equal in-phase signals at AM frequencies that add to provide the receiver with a signal substantially twice that available from a single antenna. It is within the principles of the invention to use any plurality of antennas with adjacent antennas separated by a distance comparable to a wavelength at FM band frequencies with the extreme ones of the antennas separated by a distance significantly less than a wavelength at AM frequencies.

Other embodiments are within the following claims.

What is claimed is:

1. A radio receiver circuit constructed and arranged to operate over a first range of frequencies and a second range of frequencies significantly lower than said first range comprising:

at least first and second spaced antenna elements, said antenna elements having first and second outputs respectively, said antenna elements being significantly less than one quarter of a wavelength in length at said first range of frequencies, a first circuit operating at said first range of frequencies having first and second inputs coupled to said first and second outputs respectively, and first and second first frequency outputs for providing a pair of received first frequency signals at a common desired frequency, a second circuit operative in said second range of frequencies including summing circuitry having first and second inputs coupled to said first and second outputs of said antenna elements respectively and including a second frequency output for providing a second frequency signal that includes a sum of second frequency signals derived from second frequency signals at said first and second outputs of said antenna elements, at least first and second tuning circuits for tunings said first and second antenna elements respectively to said common desired frequency, said first tuning circuit coupling said first output of said first antenna element to said first input of said first circuit, and said second tuning circuit coupling said second output of said second antenna element to said second input of said first circuit.

2. The receiver circuit of claim 1 wherein said first and second tuning circuits each includes a common tuning input for receiving a control signal for altering the tuning characteristics of said first and second tuning circuits.

3. The receiver circuit of claim 1 wherein said first tuning circuit includes a first pair of controllable reactive elements places in series with said first output of said first antenna element, and said second tuning circuit includes a second pair of controllable reactive elements placed in series with said second output of said second antenna element.

4. The receiver circuit of claim 2 wherein said first tuning circuit includes first and second inductors connected in series in a first electrical path between said first output of said first antenna element and ground, first and second opposing varactors and a third inductor placed in series within a second electrical path between said first antenna element output and said ground, a third electrical path which includes a first resistor being defined between a point between said first and second opposing varactors and said tuning input, a first tuned second frequency output being provided in said first electrical path between said first and second inductors, a first tuned first frequency output being provided from a first tap on said third inductor, and wherein said second tuning circuit includes fourth and fifth inductors connected in series in a fourth electrical path between said second output of said second antenna element and said ground, third and fourth opposing varactors and a sixth inductor placed in series within a fifth electrical path between said second output of said second antenna element and said ground, a sixth electrical path which includes a second resistor being coupled between a point between said third and fourth opposing varactors and said tuning input, a second tuned second frequency output being provided in said fourth electrical path between said fourth and fifth inductors, and a second tuned first frequency output being provided from a second tap on said sixth inductor.

5. The receiver of claim 4 wherein said first circuit includes a first preamplifier responsive to said first tuned first frequency output of said first tuning circuit, and a second preamplifier responsive to said second tuned first frequency output of said second tuning circuit, and wherein said second circuit includes a first second circuit preamplifier responsive to said first tuned second frequency output of said first tuning circuit, and a second second circuit preamplifier responsive to said second tuned second frequency output of said second tuning circuit, said summing circuitry including a first input responsive to said first second circuit preamplifier and a second input responsive to said second circuit preamplifier.

6. The receiver of claim 5 wherein said summing circuitry includes a resistor network.

7. The receiver of claim 1 wherein said first circuit includes a pair of first preamplifiers responsive to said tuning circuits, and wherein said second circuit includes a pair of second preamplifiers responsive to said tuning circuits, said summing circuitry being responsive to said second preamplifiers.

8. A radio receiver circuit in accordance with claim 1, wherein said summing circuitry includes a resistor network.

9. A radio receiver circuit in accordance with wherein said first and second antenna elements are each no greater than substantially ten inches in length.

10. The receiver of claim 6 wherein said first and second antenna elements are each no greater than substantially ten inches in length.

11. A radio receiver circuit in accordance with claim 1 and further including selection circuitry responsive to said first and second first frequency outputs of said first circuit for selecting one of the pair of received first frequency signals with the highest value of a desired quality.

12. The receiver of claim 10 further including selection circuitry responsive to said first and second first frequency outputs of said first circuit for selecting one of the pair of received first frequency signals with the highest value of a desired quality.

13. A method of receiving radio signals comprising:

providing RF signals over a first range of frequencies and a second range of frequencies significantly lower than said first range at the output of a pair of antennas which are significantly less than one quarter of a wavelength in length at said first range of frequencies, tuning each of said pair of antennas with tuning circuitry to a common desired frequency in said first range of frequencies to provide a pair of tuned first frequency signals in said first range of frequencies, selecting the provided RF signals in said second range of frequencies from each of said pair of antennas to provide a pair of second frequency signals in said second range of frequencies, and summing the second frequency signals to yield a summed second frequency signal.

14. The method of claim 13, wherein the steps of summing to yield said summed second frequency signal and tuning to provide first frequency signals are performed at different times, and further including the step of altering the tuning characteristics of the tuning circuitry by changing a tuning control signal.

15. The method of claim 14 wherein said step of altering the tuning characteristics includes, during first frequency signals reception, altering the tuning characteristics to improve reception of the received first frequency signals.

16. The method of claim 15, wherein said tuning circuitry includes two pairs of oppositely poled varactors each receiving a bias signal and placed in series with a respective one of said antennas and said step of altering tuning characteristics includes changing said bias signal.

17. The method of claim 16, further including the step of selecting one of the pair of tuned first frequency signals with the highest value of a desired quality.

18. The method of claim 17, further including, before the step of selecting one of the pair of tuned first frequency signals, preamplifying the tuned first frequency signals and, before the step of summing, preamplifying the tuned second frequency signals.

19. The method of claim 13, further including preamplifying the tuned first frequency signals and, before the step of summing, preamplifying the pair of second frequency signals.

20. The method of claim 14, wherein said tuning circuitry includes two pairs of oppositely poled varactors each receiving a bias signal and placed in series with a respective one of said antennas and said step of altering tuning characteristics by changing a tuning control signal includes changing said bias: signal.

21. The method of claim 13, further including the step of selecting one of the pair of tuned first frequency signals with the highest value of a desired quality.

22. A method of receiving radio signals in accordance with claim 13 and further including, positioning said pair of antennas so that the separation between said pair of antennas is comparable to a wavelength at frequencies in said first range of frequencies and significantly less than a wavelength at frequencies in said second range of frequencies.

23. A method of receiving radio signals in accordance with claim 13 wherein said first range of frequencies embraces the FM band and said second range of frequencies embraces the AM band and further including the step of locating said pair of antennas separated by a distance of the order of a wavelength at frequencies in said FM band and significantly less than a wavelength at frequencies in the AM band.

24. A radio receiver circuit constructed and arranged to operate over a first range of frequencies and a second range of frequencies significantly lower than said first range comprising, at least first and second antenna elements having first and second outputs respectively, said antenna elements being significantly less than ¼ of a wavelength in length at a desired frequency of operation in said first range of frequencies, at least an AM circuit operative in said second range of frequencies including summing circuitry having first and second inputs coupled to said first and second outputs of said antenna elements respectively and including an AM output for providing an AM signal that includes a sum of signals derived from said first and second outputs of said antenna elements, a first circuit operating at said first range of frequencies having first and second inputs coupled to said first and second outputs respectively and first and second first frequency outputs for providing a pair of received first frequency signals at a common desired frequency, at least first and second tuning circuits for tuning said first and second antenna elements respectively to said common desired frequency, said first tuning circuit coupling said first output of said first antenna element to said first input of said first circuit, and said second tuning circuit coupling said output of said second antenna element to said second input of said first circuit.

25. A radio receiver circuit in accordance with claim 24 and further comprising, an FM circuit having first and second inputs coupled to said first and second outputs respectively, and first and second FM outputs for providing a pair of received FM signals.

26. A radio receiver circuit in accordance with claim 25 wherein each of said antenna elements has a base end and a tip end and said FM circuit comprises first and second FM preamplifier circuits located at respective base ends of said first and second antenna elements respectively.

27. A radio receiver circuit in accordance with claim 24 wherein the separation between said first and second antenna elements is comparable to a wavelength at frequencies in the FM band and significantly less than a wavelength at frequencies in the AM band.

* * * * *

UNITED STATES PATENT AND TRADEMARK OFFICE
CERTIFICATE OF CORRECTION

PATENT NO.   : 5,483,693

DATED        : January 9, 1996

INVENTOR(S)  : Amar G. Bose and Richard Kirkpatrick

It is certified that error appears in the above-identified patent and that said Letters Patent is hereby corrected as shown below:

Column 2, line 38, "lends" should read --ends--.

Column 5, line 44, "tunings" should read --tuning--.

Column 6, line 58, after "with" should read --claim 1--.

Signed and Sealed this

Sixth Day of May, 1997

Attest:

Attesting Officer

BRUCE LEHMAN

Commissioner of Patents and Trademarks